US011643586B2

(12) United States Patent
Wang et al.

(10) Patent No.: US 11,643,586 B2
(45) Date of Patent: May 9, 2023

(54) THERMALLY CONDUCTIVE THERMOPLASTIC COMPOSITIONS WITH GOOD DIELECTRIC PROPERTY AND THE SHAPED ARTICLE THEREFORE

(71) Applicant: SHPP Global Technologies B.V., Bergen op Zoom (NL)

(72) Inventors: Jian Wang, Shanghai (CN); Shijie Song, Shanghai (CN); Yaqin Zhang, Shanghai (CN)

(73) Assignee: SHPP Global Technologies B.V., Bergen op Zoom (NL)

( * ) Notice: Subject to any disclaimer, the term of this patent is extended or adjusted under 35 U.S.C. 154(b) by 204 days.

(21) Appl. No.: 17/040,733

(22) PCT Filed: Mar. 26, 2019

(86) PCT No.: PCT/IB2019/052457
§ 371 (c)(1),
(2) Date: Sep. 23, 2020

(87) PCT Pub. No.: WO2019/186400
PCT Pub. Date: Oct. 3, 2019

(65) Prior Publication Data
US 2021/0009886 A1 Jan. 14, 2021

(30) Foreign Application Priority Data
Mar. 26, 2018 (EP) .................................... 18163878

(51) Int. Cl.
*C09K 5/14* (2006.01)
*C08J 3/20* (2006.01)
*C08L 71/12* (2006.01)
*H05K 1/02* (2006.01)
*H05K 1/03* (2006.01)

(52) U.S. Cl.
CPC ................ *C09K 5/14* (2013.01); *C08J 3/203* (2013.01); *C08L 71/123* (2013.01); *H05K 1/024* (2013.01); *H05K 1/0373* (2013.01); *C08L 2203/20* (2013.01); *C08L 2205/035* (2013.01); *C08L 2207/066* (2013.01); *H05K 2201/0158* (2013.01)

(58) Field of Classification Search
CPC .......... C09K 5/14; C08J 3/203; C08L 71/123; C08L 71/12; C08L 2203/20; C08L 2205/02; C08L 2207/066; C08L 23/10; C08L 23/12; C08L 25/04; C08L 25/06; C08K 3/22; C08K 2003/2237; C08K 2003/2217; C08K 2003/265; C08K 2003/385; C08K 3/28; C08K 13/02; C08K 2201/001; H05K 1/024; H05K 1/0373
See application file for complete search history.

(56) References Cited

U.S. PATENT DOCUMENTS

| 4,806,297 | A | 2/1989 | Brown et al. |
| 5,739,193 | A | 4/1998 | Walpita et al. |
| 6,415,104 | B1 | 7/2002 | Fitts et al. |
| 8,552,101 | B2 | 10/2013 | I'Abee et al. |
| 8,741,998 | B2 | 6/2014 | I'Abee et al. |
| 8,946,333 | B2 | 2/2015 | Raman et al. |
| 10,557,035 | B2 * | 2/2020 | Wang ...................... C08K 3/22 |
| 10,626,262 | B2 * | 4/2020 | Wang ..................... C08L 23/14 |
| 10,647,840 | B2 * | 5/2020 | Wang ..................... C08L 67/02 |
| 11,370,911 | B2 * | 6/2022 | Cheng .................... C23C 18/204 |
| 2001/0053820 | A1 * | 12/2001 | Yeager ................ C08G 65/485 525/186 |
| 2014/0080954 | A1 | 3/2014 | Chandrashekar et al. |
| 2014/0171575 | A1 | 6/2014 | Mercx et al. |
| 2016/0280972 | A1 * | 9/2016 | Bandyopadhyay .. C09D 133/08 |
| 2017/0055339 | A1 * | 2/2017 | Zhang .................... C08J 9/0071 |
| 2020/0010674 | A1 * | 1/2020 | Wang ..................... C08L 25/06 |
| 2022/0396697 | A1 * | 12/2022 | Rosling .................. C08L 67/04 |

FOREIGN PATENT DOCUMENTS

| JP | 2011-116870 A | 6/2011 |
| JP | 2015-040296 A | 3/2015 |
| KR | 20070118976 A | 12/2007 |
| KR | 2009-0046711 A | 5/2009 |
| KR | 20110084218 A | 7/2011 |
| KR | 2017-0104162 A | 9/2017 |
| WO | WO 2017/029564 A1 | 2/2017 |

OTHER PUBLICATIONS

AN 2015-151852; XP-002784222; WPI Clarivate Analytics; 2017; 3 pages.
An 2011-G62273; XP-002784223; WPI Clarivate Analytics; 2017; 2 pages.
European Patent Application No. 18163878.4; Extended Search Report; dated Sep. 10, 2018; 8 pages.
International Patent Application No. PCT/IB2019/052457; Int'l Search Report and the Written Opinion; dated Jun. 3, 2019; 12 pages.
International Patent Application No. PCT/IB2019/052457; Int'l Preliminary Report on Patentability; dated Oct. 8, 2020; 8 pages.

* cited by examiner

*Primary Examiner* — Jane L Stanley
(74) *Attorney, Agent, or Firm* — Quicker Law, LLC

(57) ABSTRACT

A polymer composition includes: from about 20 wt. % to about 80 wt. % of a polymer base resin; from about 10 wt. % to about 60 wt. % of a thermally conductive filler; and from about 5 wt. % to about 60 wt. % of a dielectric ceramic filler having a Dk of at least 20 when measured at 1.1 GHz or greater. The polymer composition exhibits a dielectric constant greater than 3.0 at 1.1 GHz when tested using a split post dielectric resonator and network analyzer on a sample size of 120 mm by 120 mm and 6 mm thickness according to ASTM D150. The polymer composition exhibits a dissipation factor of less than 0.002 at 1.1 GHz when tested using a split post dielectric resonator and network analyzer on a sample size of 120 mm by 120 mm and 6 mm thickness according to ASTM D150.

16 Claims, No Drawings

THERMALLY CONDUCTIVE THERMOPLASTIC COMPOSITIONS WITH GOOD DIELECTRIC PROPERTY AND THE SHAPED ARTICLE THEREFORE

CROSS-REFERENCE TO RELATED APPLICATION

This application is the National Stage of International Application No. PCT/IB2019/052457 filed Mar. 26, 2019, which claims priority to and the benefit of European Application No. 18163878.4 filed Mar. 26, 2018, the disclosures of which are incorporated herein by this reference in their entireties.

TECHNICAL FIELD

The disclosure relates to thermoplastic compositions exhibiting high dielectric constant and low dissipation factor.

BACKGROUND

Many consumer-oriented industries require blended thermoplastic compositions that provide an array of varying properties. Very high stiffness with balanced impact resistance, receptivity to color, chemical resistance to everyday chemicals, flow properties for thin wall processing, and transparency to wireless signals represent a few desirable attributes across a number of manufacturing areas. In the electronics industry as well as in the automotive industry, thermoplastics having high dielectric constants are desired. These thermoplastics are also expected to be easily processable while maintaining certain mechanical properties. There remains a need in the art for thermally conductive thermoplastic compositions that provide high dielectric constant and a low dissipation factor while also exhibiting desirable mechanical and processing performance.

SUMMARY

Aspects of the present disclosure relate to a thermoplastic composition comprising: from about 20 wt. % to about 80 wt. % of a polymer base resin; from about 10 wt. % to about 60 wt. % of a thermally conductive filler; from about 5 wt. % to about 30 wt. % of an impact modifier; and from about 0.1 wt. % to about 60 wt. % of a dielectric ceramic filler having a Dk of at least 25 when tested at 1.1 gigahertz (GHz) or greater, wherein the polymer composition exhibits a dielectric constant greater than 3.0 at 1.1 GHz when tested using a split post dielectric resonator and network analyzer on a sample size of 120 millimeter (mm) by 120 mm and 6 mm thickness, wherein the polymer composition exhibits a dissipation factor of less than 0.002 at 1.1 GHz when tested using a split post dielectric resonator and network analyzer on a sample size of 120 mm by 120 mm and 6 mm thickness, and wherein the combined weight percent value of all components does not exceed about 100 wt. %, and all weight percent values are based on the total weight of the composition.

Other aspects of the present disclosure relate to a method of forming a polymer composition comprising: combining a polymer base resin comprising a polyarylene ether, a polystyrene, a polypropylene, or a combination thereof; a thermally conductive filler; an impact modifier; and a dielectric ceramic filler, wherein the polymer composition exhibits a dielectric constant greater than 3.0 at 1.1 GHz when tested using a split post dielectric resonator and network analyzer on a sample size of 120 mm by 120 mm and 6 mm thickness, wherein the polymer composition exhibits a dissipation factor of less than 0.002 at 1.1 GHz when tested using a split post dielectric resonator and network analyzer on a sample size of 120 mm by 120 mm and 6 mm thickness and wherein the combined weight percent value of all components does not exceed about 100 wt. %, and all weight percent values are based on the total weight of the composition.

In certain aspects, the disclosure relates to a method of forming an article including the steps of molding an article from the polymer composition described herein.

DETAILED DESCRIPTION

Thermoplastics with high dielectric constant (Dk) and low dissipation factor may be desirable for applications in the wireless communication area. However, concerns arise as heat may be generated during operation even if the material has a relatively low dissipation factor. High heat may also damage the thermoplastic; decreasing the lifetime and reducing efficiency. Thermally conductive thermoplastics may provide a sustained transfer of heat to avoid damage. Both thermally conductive and high dielectric thermoplastics tend to require a relatively high loading of inorganic filler to ensure these properties. It is thus challenging to balance the dielectric property and thermal conductivity of thermoplastic compositions, as well as their mechanical and processing performance. Aspects of the present disclosure provide thermally conductive thermoplastic compositions having a high dielectric constant while maintaining desirable mechanical properties and processing characteristics.

In one aspect, the present disclosure relates to a polymer composition comprising a polymer base resin, a thermally conductive filler, and a dielectric ceramic filler. The polymer composition may exhibit a dielectric constant greater than 3.0 at 1.1 GHz when tested using a split post dielectric resonator and network analyzer on a sample size of 120 mm by 120 mm and 6 mm thickness and a dissipation factor of less than 0.002 at 1.1 GHz when tested using a split post dielectric resonator and network analyzer on a sample size of 120 mm by 120 mm and 6 mm thickness.

Polymer Base Resin

In an aspect, the polymer composition can comprise a polymer base resin. In various aspects, the polymer base resin can comprise a thermoplastic resin or a thermoset resin. The thermoplastic resin can comprise polypropylene, polyethylene, ethylene-based copolymer, polyamide, polycarbonate, polyester, polyoxymethylene (POM), polybutylene terephthalate (PBT), polyethylene terephthalate (PET), polycyclohexylendimethylene terephthalate (PCT), liquid crystal polymers (LPC), polyphenylene sulfide (PPS), polyarylene ether such as for example polyphenylene ether (PPE) or polyphenylene oxide-polystyrene blends, polystyrene, high impact modified polystyrene, acrylonitrile-butadiene-styrene (ABS) terpolymer, acrylic polymer, polyetherimide (PEI), polyurethane, polyetheretherketone (PEEK), polylactic acid (PLA)-based polymers, poly ether sulfone (PES), and combinations thereof. The thermoplastic resin can also include thermoplastic elastomers such as polyamide and polyester-based elastomers. The base substrate can also comprise blends and/or other types of combination of resins described above. In various aspects, the polymer base resin can also comprise a thermosetting polymer. Appropriate thermosetting resins can include phenol resin, urea resin, melamine-formaldehyde resin, urea-formaldehyde latex, xylene resin, diallyl phthalate resin, epoxy resin, aniline resin, furan resin, polyurethane, or combinations thereof. In certain aspects, the polymer base resin comprises a polyarylene ether, a polypropylene, a polystyrene, or a combination thereof.

The amount of polymer base resin in the composition of the disclosure is from about 20 wt. % to about 80 wt %. For example, the amount of polypropylene in the composition may be from about 20 wt. % to 80 wt. %, from about 20 wt. % to about 70 wt %, from about 20 wt. % to about 60 wt %, from about 20 wt. % to about 50 wt %, from about 20 wt. % to about 40 wt %, from about 30 wt. % to about 80 wt %, from about 40 wt. % to about 80 wt %, from about 50 wt. % to about 80 wt %, or from about 60 wt. % to about 80 wt %.

The polymer base resin of the present disclosure may include a polyarylene ether. Suitable poly(arylene ether)s include those comprising repeating structural units having the formula

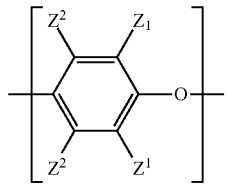

wherein each occurrence of $Z^1$ is independently halogen, unsubstituted or substituted $C_1$-$C_{12}$ hydrocarbyl provided that the hydrocarbyl group is not tertiary hydrocarbyl, $C_1$-$C_{12}$ hydrocarbylthio, $C_1$-$C_{12}$ hydrocarbyloxy, or $C_2$-$C_{12}$ halohydrocarbyloxy wherein at least two carbon atoms separate the halogen and oxygen atoms; and each occurrence of $Z^2$ is independently hydrogen, halogen, unsubstituted or substituted $C_1$-$C_{12}$ hydrocarbyl provided that the hydrocarbyl group is not tertiary hydrocarbyl, $C_1$-$C_{12}$ hydrocarbylthio, $C_1$-$C_{12}$ hydrocarbyloxy, or $C_2$-$C_{12}$ halohydrocarbyloxy wherein at least two carbon atoms separate the halogen and oxygen atoms.

As used herein, the term "hydrocarbyl", whether used by itself, or as a prefix, suffix, or fragment of another term, refers to a residue that contains only carbon and hydrogen. The residue can be aliphatic or aromatic, straight-chain, cyclic, bicyclic, branched, saturated, or unsaturated. It can also contain combinations of aliphatic, aromatic, straight chain, cyclic, bicyclic, branched, saturated, and unsaturated hydrocarbon moieties. However, when the hydrocarbyl residue is described as substituted, it may, optionally, contain heteroatoms over and above the carbon and hydrogen members of the substituent residue. Thus, when specifically described as substituted, the hydrocarbyl residue may also contain one or more carbonyl groups, amino groups, hydroxyl groups, or the like, or it may contain heteroatoms within the backbone of the hydrocarbyl residue. As one example, $Z^1$ may be methyl and $Z^2$ may be hydrogen as in polyphenyl oxide.

The poly(arylene ether) may be in the form of a homopolymer, a copolymer, a graft copolymer, an ionomer, or a block copolymer, as well as combinations comprising at least one of the foregoing. In some examples, the poly(arylene ether) component comprises a poly(phenyl ether) or polyphenylene ether, designated PPE or PPO.

The poly(arylene ether) may have a number average molecular weight of 3,000 to 40,000 atomic mass units (amu) and a weight average molecular weight of 5,000 to 80,000 amu, as determined by gel permeation chromatography. The poly(arylene ether) may have an intrinsic viscosity of 0.10 to 0.60 deciliters per gram (dl/g), or, more specifically, 0.29 to 0.48 dl/g, as measured in chloroform at 25° C. It is possible to utilize a combination of high intrinsic viscosity poly(arylene ether) and a low intrinsic viscosity poly(arylene ether). Determining an exact ratio, when two intrinsic viscosities are used, will depend somewhat on the exact intrinsic viscosities of the poly(arylene ether) used and the ultimate physical properties that are selected.

Suitable polyphenylene ether polymers for the present disclosure may include, but are not limited to, poly(2,6-dimethyl-1,4-phenylene)ether; poly(2,3,6-trimethyl-1,4-phenylene)ether; poly(2,6-diethyl-1,4-phenylene)ether; poly(2-methyl-6-propyl-1,4-phenylene)ether; poly(2,6-dipropyl-1,4-phenylene)ether; poly(2-ethyl-6-propyl-1,4-phenylene)ether; poly(2,6-dilauryl-1,4-phenylene)ether; poly(2,6-diphenyl-1,4-phenylene)ether; poly(2,6-dimethoxy-1,4-phenylene)ether; poly(2,6-diethoxy-1,4-phenylene)ether; poly(2-methoxy-6-ethoxy-1,4-phenylene)ether; poly(2-ethyl-6-stearyloxy-1,4-phenylene)ether; poly(2,6-dichloro-1,4-phenylene)ether; poly(2-methyl-6-phenyl-1,4-phenylene)ether; poly(2,6-dibenzyl-1,4-phenylene)ether; poly(2-ethoxy-1,4-phenylene)ether; poly(2-chloro-1,4-phenylene)ether; poly(2,6-dibromo-1,4-phenylene)ether; poly(3-bromo-2,6-dimethyl-1,4-phenylene)ether, copolymers thereof and mixtures thereof, and the like. In select aspects, polyphenylene ether polymers for use in the compositions of the present disclosure include poly(2,6-dimethyl-1,4-phenylene)ether, poly(2,3,6-trimethyl-1,4-phenylene)ether, blends of these polymers and copolymers including units of 2,3,6-trimethyl-1,4-phenylene ether and units of 2,6-dimethyl-1,4-phenylene ether. Examples of such polymers and copolymers are also set forth in U.S. Pat. No. 4,806,297. In yet further examples, the poly(arylene ether) component may comprise a poly(arylene ether) polysiloxane block copolymer. In some aspects, the poly(arylene ether)-polysiloxane block copolymer may comprise a poly(arylene ether) block and a polysiloxane block. The composition may poly(arylene ether)-polysiloxane block copolymer reaction product comprising a poly(arylene ether) homopolymer, and a poly(arylene ether)-polysiloxane block copolymer comprising a poly(arylene ether) block, and a polysiloxane block comprising, on average, about 20 to about 80 siloxane repeating units; wherein the poly(arylene ether) block comprises arylene ether repeating units. The poly(arylene ether) block may be a residue of the polymerization of the monohydric phenol. In some examples, the poly(arylene ether) block comprises arylene ether repeating units having the structure (as indicated above)

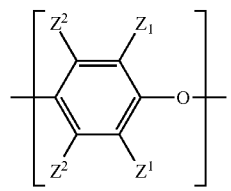

wherein for each repeating unit, each $Z^1$ is independently halogen, unsubstituted or substituted $C_1$-$C_{12}$ hydrocarbyl provided that the hydrocarbyl group is not tertiary hydrocarbyl, $C_1$-$C_{12}$ hydrocarbylthio, $C_1$-$C_{12}$ hydrocarbyloxy, or $C_2$-$C_{12}$ halohydrocarbyloxy wherein at least two carbon atoms separate the halogen and oxygen atoms; and each $Z^2$ is independently hydrogen, halogen, unsubstituted or substituted $C_1$-$C_{12}$ hydrocarbyl provided that the hydrocarbyl group is not tertiary hydrocarbyl, $C_1$-$C_{12}$ hydrocarbylthio, $C_1$-$C_{12}$ hydrocarbyloxy, or $C_2$-$C_{12}$ halohydrocarbyloxy wherein at least two carbon atoms separate the halogen and oxygen atom. In certain examples, the poly(arylene ether) block comprises 2,6-dimethyl-1,4-phenylene ether repeating units, that is, repeating units having the structure

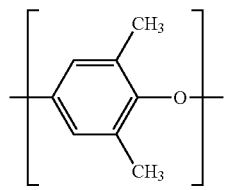

2,3,6-trimethyl-1,4-phenylene ether repeating units, or a combination thereof.

The polysiloxane block may be a residue of the hydroxyaryl-terminated polysiloxane. In some aspects, the polysiloxane block comprises repeating units having the structure

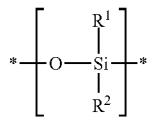

wherein each occurrence of $R^1$ and $R^2$ is independently hydrogen, $C_1$-$C_{12}$ hydrocarbyl or $C_1$-$C_{12}$ halohydrocarbyl; and the polysiloxane block further comprises a terminal unit having the structure

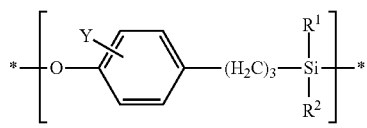

wherein Y is hydrogen, $C_1$-$C_{12}$ hydrocarbyl, $C_1$-$C_{12}$ hydrocarbyloxy, or halogen, and wherein each occurrence of $R^3$ and $R^4$ is independently hydrogen, $C_1$-$C_{12}$ hydrocarbyl or $C_1$-$C_{12}$ halohydrocarbyl. In some examples, the polysiloxane repeating units comprise dimethylsiloxane (—Si(CH$_3$)$_2$O—) units. In further examples, the polysiloxane block has the structure

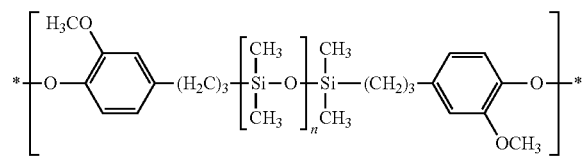

wherein n is 35 to 60.

The hydroxyaryl-terminated polysiloxane may comprise at least one hydroxyaryl terminal group. In some aspects, the hydroxyaryl-terminated polysiloxane has a single hydroxyaryl terminal group, in which case a poly(arylene ether)-polysiloxane di-block copolymer is formed. In other aspects, the hydroxyaryl-terminated polysiloxane has two hydroxyaryl terminal groups, in which case in which case poly (arylene ether)-polysiloxane di-block and/or tri-block copolymers are formed. It is also possible for the hydroxyaryl-terminated polysiloxane to have a branched structure that allows three or more hydroxyaryl terminal groups and the formation of corresponding branched copolymers.

As noted above, the polysiloxane block may, on average, 35 to 80 siloxane repeating units. Within this range, the number of siloxane repeating units can be 35 to 60, more specifically 40 to 50. The number of siloxane repeating units in the polysiloxane block is essentially unaffected by the copolymerization and isolation conditions, and it is therefore equivalent to the number of siloxane repeating units in the hydroxyaryl-terminated polysiloxane starting material. In one example, the PPO-siloxane block copolymer is a D45 copolymer indicating that the polysiloxane has approximately 45 siloxane repeating units.

When not otherwise known, the average number of siloxane repeating units per hydroxylaryl-terminate polysiloxane molecule can be determined by NMR methods that compare the intensity of signals associated with the siloxane repeating units to those associated with the hydroxyaryl terminal groups. For example, when the hydroxyaryl-terminated polysiloxane is a eugenol-capped polydimethylsiloxane, it is possible to determine the average number of siloxane repeating units by a proton nuclear magnetic resonance (1H NMR) method in which integrals for the protons of the dimethylsiloxane resonance and the protons of the eugenol methoxy group are compared.

The thermoplastic composition may comprise from 1 to 8 weight percent siloxane repeating units and 12 to 99 weight percent arylene ether repeating units, based on the total weight of the thermoplastic composition. Within these ranges, the weight percent of siloxane repeating units can be 2 to 7 weight percent, specifically 3 to 6 weight percent, more specifically 4 to 5 weight percent; and the weight percent arylene ether repeating units can be 50 to 98 weight percent, specifically 70 to 97 weight percent, more specifically 90 to 96 weight percent.

In a further aspect, the polymeric base resin can have a weight average molecular weight from about 30,000 to about 150,000 Daltons or atomic mass units. The thermoplastic composition may comprise a poly(arylene ether) having a weight average molecular weight of 85,000 to 120,000 atomic mass units, specifically 85,000 to 100,000 atomic mass units, more specifically 85,000 to 95,000 atomic mass units, even more specifically 88,000 to 92,000 atomic mass units. It will be understood that this weight average molecular weight range refers to the poly(arylene ether) in the final composition—that is, after compounding with other components. Those skilled in the processing of poly(arylene ether)s recognize that their molecular weight can increase significantly (e.g., 5 to 15 percent) under the melt kneading conditions used to form a thermoplastic blend. So, the weight average molecular weight of the poly(arylene ether) component can be less 85,000 atomic mass units before it is melt kneaded with the other components of the composition.

The polymer base resin may comprise a polypropylene. Polypropylene may refer to a polymer based on propylene as the single or predominantly present monomer. The polypropylene polymer may be a homopolymer, a copolymer or a random polymer. As an example, the polypropylene may be a propylene/α-olefin copolymer. Each α-olefin monomer may have 2-12 carbon atoms. The α-olefin monomer may be selected from the group comprising ethylene, butylene and octene. The polypropylene polymer can be a polymer made by any known polymerization technique as well as with any known polymerization catalyst system. Regarding the techniques, reference can be given to slurry, solution or gas phase polymerizations; regarding the catalyst system reference can be given to Ziegler-Natta, metallocene, or (other) single-site catalyst systems. All are, in themselves, known in the art.

In some aspects the polypropylene polymer has a melt flow index (MFI), measured according to ISO 1133 at 230 degrees Celsius (° C.) and 2.16 kilogram (kg), of between 0.1 and 100, or between 1 and 50 in other aspects. In further aspects, the composition may comprise a polypropylene. With polypropylene as used herein is meant propylene homopolymer or a copolymer of propylene with an a-olefin, for example an a-olefin chosen from the group of a-olefin having 2 or 4 to 10 C-atoms, for example wherein the amount of α-olefin is less than 10 wt % based on the total propylene copolymer.

Polypropylene and a copolymer of propylene with an α-olefin can be made by any known polymerization technique as well as with any known polymerization catalyst system. Regarding the techniques, reference can be given to slurry, solution or gas phase polymerizations; regarding the catalyst system reference can be given to Ziegler-Natta, metallocene or single-site catalyst systems. All are, in themselves, known in the art. In certain aspects the polypropylene used in the present disclosure is a propylene homopolymer.

In some aspects, the amount of polypropylene in the composition of the disclosure is from about 20 wt. % to about 80 wt %. For example, the amount of polypropylene in the composition may be from about 20 wt. % to 80 wt. %, from about 20 wt. % to about 70 wt %, from about 20 wt. % to about 60 wt %, from about 20 wt. % to about 50 wt %, from about 20 wt. % to about 40 wt %, from about 30 wt. % to about 80 wt %, from about 40 wt. % to about 80 wt %, from about 50 wt. % to about 80 wt %, or from about 60 wt. % to about 80 wt %.

In case the polypropylene matrix phase comprises a propylene copolymer, the propylene copolymer may be a propylene random copolymer. Where the polypropylene matrix phase comprises a propylene comonomer, the copolymer comprises monomers copolymerizable with propylene, for example comonomers such as ethylene and/or C4-20 cc-olefins, in particular ethylene and/or C4-10 cc-olefins, e.g. 1-butene and/or 1-hexene. In some aspects the propylene copolymer (e.g., the propylene random copolymer) comprises monomers copolymerizable with propylene from the group consisting of ethylene, 1-butene and 1-hexene. More specifically the propylene copolymer (e.g., the propylene random copolymer) comprises, next to propylene, units derivable from ethylene and/or 1-butene. In one aspect, the propylene copolymer (e.g., the propylene random copolymer) consists of units derivable from ethylene and propylene. The comonomer content in the polypropylene matrix is may be 5.0% or less by total weight of the polypropylene matrix, such as 0.5-5%, or 1-5%, or 1-4%, or 1-3%.

The melt flow rate of the polypropylene may be from 10-60 grams per 10 minutes (g/10 min) (ISO 1133, 2.16 kg at 230° C.), or in some aspects from 20-60 g/10 min or 25-45 g/10 min.

In further examples, the disclosed composition may comprise a polystyrene as the polymer base resin. Suitable polystyrenes include homopolystyrenes (including atactic, syndiotactic, and isotactic polystyrenes) and rubber-modified polystyrenes (also known as "high-impact polystyrenes" or "HIPS"). In some aspects, the polystyrene comprises a homopolystyrene having a number average molecular weight of about 30,000 to about 100,000 atomic mass units, specifically about 40,000 to about 60,000 atomic mass units. Suitable homopolystyrenes are commercially available as, for example EB3300 from Chevron.

Homopolystyrenes refer to homopolymers of polystyrene. As used herein, the term homopolystyrene refers to a homopolymer of styrene. Thus, the residue of any monomer other than styrene is excluded from the homopolystyrene. The homopolystyrene can be atactic, syndiotactic, or isotactic. Suitable homopolystyrenes are commercially available as, for example EB3300 from Chevron. In some aspects, the polystyrene comprises a rubber-modified polystyrene comprising about 88 to about 94 weight percent polystyrene and about 6 to about 12 weight percent polybutadiene, with an effective gel content of about 10% to about 35%. Suitable rubber-modified polystyrenes are commercially available as, for example, GEH 1897 from SABIC, and D7022.27 from Chevron. The polystyrene according to the present disclosure may be a homopolystyrene.

In some aspects, the polystyrene comprises a syndiotactic polystyrene. Other polystyrenes may be present in the disclosed composition; for example, a general purposes polystyrene may be present as a low Dk polymer resin. Syndiotactic polystyrene may comprise a polystyrene with a highly regular stereochemical structure, i.e., a highly syndiotactic configuration. That is, the phenyl groups and substituted phenyl groups of the side groups are alternately located at opposite positions with respect to the main polymer chain. Examples of syndiotactic polystyrene (sPS) include polystyrene, poly(p-methylstyrene), poly(m-methylstyrene), poly(p-tertiary-butylstyrene), poly(p-chlorostyrene), poly(m-chlorostyrene), poly(p-fluorostyrene), hydrogenated polystyrene, copolymers containing comprising units of the above polymers and combinations comprising one of the foregoing syndiotactic polystyrenes.

The polystyrene may be an atactic polystyrene (aPS). Atactic polystyrene, compared to sPS, may comprise a polystyrene with an irregular stereochemical structure. Phenyl groups and substituted phenyl groups of the side groups are randomly located at positions along the main polymer chain. A suitable atactic polystyrene may be a general purpose polystyrene GPPS. GPPS may have a Dk of about 2.55.

In some examples, the polymeric base resin can be present in the thermoplastic composition in an amount from about 20 wt. % to about 90 wt. %. In other aspects, the polymeric base resin can be present in an amount, from about 20 wt. % to about 80 wt. %, from about 20 wt. % to about 70 wt. %, from about 20 wt. % to about 60 wt. % from about 30 wt. % to about 80 wt. %, or from about 40 wt. % to about 70 wt. %, or from about 50 wt. % to about 70 wt. %, or from about 55 wt. % to about 65 wt. %. The thermoplastic composition may comprise from about 50 weight percent (wt. %) to about 90 weight percent of the poly(arylene ether), based on the total weight of the composition. The polyarylene ether may be present in any amount between the endpoints. For example, the composition may comprise about 70 wt. % of a polyarylene ether.

Thermally Conductive Filler

In various aspects, the composition can comprise a thermally conductive filler. Exemplary thermally conductive fillers include white thermally conductive fillers, which include, but are not limited to, ZnS (zinc sulfide), CaO (calcium oxide), MgO (magnesium oxide), ZnO (zinc oxide), or $TiO_2$ (titanium dioxide), tin dioxide, chromium Oxide, $CaCO_3$ (calcium carbonate), mica, BaO (barium oxide), $BaSO_4$ (barium sulfate), $CaSO_4$ (calcium sulfate), $CaSiO_3$ (wollastonite), $ZrO_2$ (Zirconium oxide), $SiO_2$ (Silicon oxide), Glass beads, Glass fiber, $MgO.xAl_2O_3$ (magnesium aluminate), $CaMg(CO_3)_2$ (dolomite), coated graphite, $Mg(OH)_2$ (magnesium hydroxide), $H_2Mg_3(SiO_3)_4$ (talc), γ-AlO(OH) (boehmite), α-AlO(OH) (diaspore), $Al(OH)_3$ (Gibbsite), clay; AlN (aluminum nitride), $Al_4C_3$ (aluminum carbide), $Al_2O_3$ (aluminum oxide), BN (boron nitride), AlON (aluminum oxynitride), $MgSiN_2$ (magnesium silicon nitride), SiC (silicon carbide), $Si_3N_4$ (silicon nitride), tungsten oxide, aluminum phosphide, beryllium oxide, boron phosphide, cadmium sulfide, gallium nitride, zinc silicate, and $WO_3$, dark color thermally conductive fillers with certain white coating, which include graphite, expanded graphite, expandable graphite, graphene, carbon fiber, CNT (carbon nano-tube); or a combination thereof. In some aspects, the thermally conductive filler may have a thermal conductivity of greater than 5 watts per meter kelvin (W/m*K).

In some aspects, the composition can comprise a thermally conductive filler having a certain particle size and/or surface area. As an example, the thermally conductive filler may have a particle size distribution $D_{50}$ between 100 nanometers (nm) and 500 micrometers (μm). In a further example, the suitable thermally conductive fillers may have a surface area between 0.1 square meters per gram ($m^2/g$) and 2000 $m^2/g$.

In various further aspects, the thermally conductive filler may have a particular shape. For example, the thermally conductive filler may comprise spheres or beads, blocks, flakes, fibers, whisker, needle-like shapes or a combination thereof. The thermally conductive filler may have any dimensionality, including 1D, 2D and 3D geometries.

In some aspects, the composition may comprise from about 8 wt. % to about 60 wt. % of a thermally conductive filler. For example, the composition may comprise from about 10 wt. % to about 60 wt. % of a thermally conductive filler. In further aspects the composition may include from about 8 wt. % to about 70 wt. % of a thermally conductive filler, or from about 35 wt. % to about 70 wt. % of a thermally conductive filler, or from about 50 wt. % to about 60 wt. % of a thermally conductive filler, or from about 20 wt. % to about 50 wt. % of a thermally conductive filler, or from about 8 wt. % to about 60 wt % of a thermally conductive filler, or from about 8 wt. % to about 65 wt % of a thermally conductive filler, or from about 8 wt. % to about 40 wt. % of a thermally conductive filler, or from about 8 wt. % to about 35 wt. % of a thermally conductive filler, or from about 10 wt. % to about 40 wt. % of a thermally conductive filler. The thermally conductive filler may comprise a combination of one or more thermally conductive fillers.

Dielectric Ceramic Filler

In addition to the polymer base resin and thermally conductive filler, the polymer composition of the present disclosure may also include a dielectric ceramic filler. Ceramic fillers provided herein are ceramic fillers having a high dielectric constant. The ceramic fillers may have a dielectric constant of at least 20 when tested at 1.1 GHz. Examples of suitable ceramic fillers are inorganic oxides, metal oxides, silicates, borides, carbides, metal carbides, nitrides, metal hydroxides, perovskites and perovskites derivatives, or the like, or a combination including at least one of the foregoing materials. Metal cations in the foregoing ceramic fillers can be transition metals, alkali metals, alkaline earth metals, rare earth metals, or the like, or a combination including at least one of the foregoing metal cations. In certain examples, the dielectric ceramic filler may comprise one or more of barium titanate or titanium dioxide.

Examples of suitable electrically conducting ceramic fillers are titanium diborides (TiB2) tungsten carbide (WC), tin oxide, indium tin oxide (ITO), antimony tin oxide, titanium nitride (TiN), zirconium nitride (ZrN), titanium carbide (TiC), molybdenum silicide ($MoSi_2$), potassium titanate whiskers, vanadium oxides ($V_2O_3$), or a combination including at least one of the foregoing ceramic fillers.

The dielectric ceramic filler may comprise inorganic oxides such as include calcium oxide, silicon dioxide, or the like, or a combination including at least one of the foregoing inorganic oxides. In one aspect, the ceramic filler includes metal oxides of alkali metals, alkaline earth metals, transition metals, metalloids, poor metals, or the like, or a combination including at least one of the foregoing. Examples of metal oxides include zirconates, titanates, aluminates, stannates, niobates, tantalates, rare earth oxides or the like, or a combination including at least one of the foregoing.

The dielectric ceramic filler may comprise metal oxides such as, but not limited to, cerium oxide, magnesium oxide, titanium oxide, zinc oxide, copper oxide, cerium oxide, niobium oxide, tantalum oxide, yttrium oxide, zirconium oxide, aluminum oxide (e.g., alumina and/or fumed alumina), $CaTiO_3$, $MgZrSrTiO_6$, $MgTiO_3$, $MgAl_2O_4$, $BaZrO_3$, $BaSnO_3$, $BaNb_2O_6$, $BaTa_2O_6$, $WO_3$, $MnO_2$, $SrZrO_3$, $SnTiO_4$, $ZrTiO_4$, $CaZrO_3$, $CaSnO_3$, $CaWO_4$, $MgTa_2O_6$, $MgZrO_3$, $La_2O_3$, $CaZrO_3$, $MgSnO_3$, $MgNb_2O_6$, $SrNb_2O_6$, $MgTa_2O_6$, $Ta_2O_3$, or the like, or a combination including at least one of the foregoing metal oxides.

The dielectric ceramic filler may comprise silicates such as, but not limited to, $Na_2SiO_3$, $LiAlSiO_4$, $Li_4SiO_4$, $BaTiSi_3O_9$, $Al_2Si_2O_7$, $ZrSiO_4$, $KAlSi_3O_8$, $NaAlSi_3O_8$, $CaAl_2Si_2O_8$, $CaMgSi_2O_6$, $Zn_2SiO_4$, or the like, or a combination including at least one of the foregoing silicates.

The dielectric ceramic filler may comprise borides including, but not limited to, lanthanum boride ($LaB_6$), cerium boride ($CeB_6$), strontium boride ($SrB_6$), aluminum boride, calcium boride ($CaB_6$), titanium boride ($TiB_2$), zirconium boride ($ZrB_2$), vanadium boride ($VB_2$), tantalum boride ($TaB_2$), chromium borides (CrB and $CrB_2$), molybdenum borides ($MoB_2$, $Mo_2B_5$ and MoB), tungsten boride ($W_2B_5$), or the like, or a combination including at least one of the foregoing borides.

The dielectric ceramic filler may comprise carbides including, but not limited to, silicon carbide, tungsten carbide, tantalum carbide, iron carbide, titanium carbide, or the like, or a combination including at least one of the foregoing carbides.

The dielectric ceramic filler may comprise nitrides including, but not limited to, silicon nitride, boron nitride, titanium nitride, aluminum nitride, molybdenum nitride, or the like, or a combination including at least one of the foregoing nitrides.

The dielectric ceramic filler may comprise perovskites and perovskite derivatives including, but not limited to, barium titanate ($BaTiO_3$), strontium titanate ($SrTiO_3$), barium strontium titanate, strontium-doped lanthanum manganate, lanthanum aluminum oxides ($LaAlO_3$), calcium copper titanate ($CaCu_3Ti_4O_{12}$), cadmium copper titanate ($CdCu_3Ti_4O_{12}$), $Ca_{1-x}La_xMnO_3$, (Li, Ti) doped NiO, lanthanum strontium copper oxides (LSCO), yttrium barium copper oxides ($YBa_2Cu_3O_7$), lead zirconate titanate, lanthanum-modified lead zirconate titanate, or the like, or a combination including at least one of the foregoing perovskites and perovskite derivatives.

The composition may comprise from about 5 wt. % to about 60 wt. % of a dielectric ceramic filler having a Dk of at least 25 when measured at 1.1 GHz or greater. In further examples, the composition may comprise from about 5 wt. % to about 50 wt. % of a dielectric ceramic filler, or from about 10 wt. % to about 60 wt. % of a dielectric ceramic filler, from about 15 wt. % to about 50 wt. % of a dielectric ceramic filler, from about 5 wt. % to about 40 wt. % of a dielectric ceramic filler, from about 10 wt. % to about 55 wt. % of a dielectric ceramic filler, from about 15 wt. % to about 55 wt. % of a dielectric ceramic filler having a Dk of at least 25 when measured at 1.1 GHz or greater.

Additives

The disclosed thermoplastic composition can comprise one or more additives conventionally used in the manufacture of molded thermoplastic parts with the proviso that the optional additives do not adversely affect the desired properties of the resulting composition. Mixtures of optional additives can also be used. Such additives can be mixed at a suitable time during the mixing of the components for forming the composite mixture. Exemplary additives can include ultraviolet agents, ultraviolet stabilizers, heat stabilizers, antistatic agents, anti-microbial agents, anti-drip agents, radiation stabilizers, pigments, dyes, fibers, fillers, plasticizers, fibers, flame retardants, antioxidants, lubricants, wood, glass, and metals, and combinations thereof.

The thermoplastic composition disclosed herein can comprise one or more additional fillers. The filler can be selected to impart additional impact strength and/or provide additional characteristics that can be based on the final selected characteristics of the polymer composition. In some aspects, the filler(s) can comprise inorganic materials which can include clay, titanium oxide, asbestos fibers, silicates and silica powders, boron powders, calcium carbonates, talc, kaolin, sulfides, barium compounds, metals and metal oxides, wollastonite, glass spheres, glass fibers, flaked fillers, fibrous fillers, natural fillers and reinforcements, and reinforcing organic fibrous fillers.

Appropriate fillers or reinforcing agents can include, for example, mica, clay, feldspar, quartz, quartzite, perlite, tripoli, diatomaceous earth, aluminum silicate (mullite), synthetic calcium silicate, fused silica, fumed silica, sand, boron-nitride powder, boron-silicate powder, calcium sulfate, calcium carbonates (such as chalk, limestone, marble, and synthetic precipitated calcium carbonates) talc (including fibrous, modular, needle shaped, and lamellar talc), wollastonite, hollow or solid glass spheres, silicate spheres, cenospheres, aluminosilicate or (armospheres), kaolin, whiskers of silicon carbide, alumina, boron carbide, iron, nickel, or copper, continuous and chopped carbon fibers or glass fibers, molybdenum sulfide, zinc sulfide, barium titanate, barium ferrite, barium sulfate, heavy spar, $TiO_2$, aluminum oxide, magnesium oxide, particulate or fibrous aluminum, bronze, zinc, copper, or nickel, glass flakes, flaked silicon carbide, flaked aluminum diboride, flaked aluminum, steel flakes, natural fillers such as wood flour, fibrous cellulose, cotton, sisal, jute, starch, lignin, ground nut shells, or rice grain husks, reinforcing organic fibrous fillers such as poly(ether ketone), polyimide, polybenzoxazole, poly(phenylene sulfide), polyesters, polyethylene, aromatic polyamides, aromatic polyimides, polyetherimides, polytetrafluoroethylene, and poly(vinyl alcohol), as well combinations comprising at least one of the foregoing fillers or reinforcing agents. The fillers and reinforcing agents can be coated with a layer of metallic material to facilitate conductivity, or surface treated, with silanes for example, to improve adhesion and dispersion with the polymer matrix. Fillers generally can be used in amounts of 1 to 200 parts by weight, based on 100 parts by weight of based on 100 parts by weight of the total composition.

In some aspects, the thermoplastic composition may comprise a synergist. In various examples fillers may serve as flame retardant synergists. The synergist facilitates an improvement in the flame-retardant properties when added to the flame retardant composition over a comparative composition that contains all of the same ingredients in the same quantities except for the synergist. Examples of mineral fillers that may serve as synergists are mica, talc, calcium carbonate, dolomite, wollastonite, barium sulfate, silica, kaolin, feldspar, barytes, or the like, or a combination comprising at least one of the foregoing mineral fillers. Metal synergists, e.g., antimony oxide, can also be used with the flame retardant. In one example, the synergist may comprise magnesium hydroxide and phosphoric acid. The mineral filler may have an average particle size of about 0.1 to about 20 micrometers, specifically about 0.5 to about 10 micrometers, and more specifically about 1 to about 3 micrometers.

The thermoplastic composition can comprise an antioxidant. The antioxidants can include either a primary or a secondary antioxidant. For example, antioxidants can include organophosphites such as tris(nonyl phenyl)phosphite, tris(2,4-di-t-butylphenyl)phosphite, bis(2,4-di-t-butylphenyl)pentaerythritol diphosphite, distearyl pentaerythritol diphosphite or the like; alkylated monophenols or polyphenols; alkylated reaction products of polyphenols with dienes, such as tetrakis[methylene(3,5-di-tert-butyl-4-hydroxyhydrocinnamate)]methane, or the like; butylated reaction products of para-cresol or dicyclopentadiene; alkylated hydroquinones; hydroxylated thiodiphenyl ethers; alkylidene-bisphenols; benzyl compounds; esters of beta-(3, 5-di-tert-butyl-4-hydroxyphenyl)-propionic acid with monohydric or polyhydric alcohols; esters of beta-(5-tert-butyl-4-hydroxy-3-methylphenyl)-propionic acid with monohydric or polyhydric alcohols; esters of thioalkyl or thioaryl compounds such as distearylthiopropionate, dilaurylthiopropionate, ditridecylthiodipropionate, octadecyl-3-(3,5-di-tert-butyl-4-hydroxyphenyl)propionate, pentaerythrityl-tetrakis[3-(3,5-di-tert-butyl-4-hydroxyphenyl) propionate or the like; amides of beta-(3,5-di-tert-butyl-4-hydroxyphenyl)-propionic acid or the like, or combinations including at least one of the foregoing antioxidants. Antioxidants can generally be used in amounts of from 0.01 to 0.5 parts by weight, based on 100 parts by weight of the total composition, excluding any filler.

In various aspects, the thermoplastic composition can comprise a mold release agent. Exemplary mold releasing agents can include for example, metal stearate, stearyl stearate, pentaerythritol tetrastearate, beeswax, montan wax, paraffin wax, or the like, or combinations including at least one of the foregoing mold release agents. Mold releasing agents are generally used in amounts of from about 0.1 to about 1.0 parts by weight, based on 100 parts by weight of the total composition, excluding any filler.

In an aspect, the thermoplastic composition can comprise a heat stabilizer. As an example, heat stabilizers can include, for example, organophosphites such as triphenyl phosphite, tris-(2,6-dimethylphenyl)phosphite, tris-(mixed mono-and di-nonylphenyl)phosphite or the like; phosphonates such as dimethylbenzene phosphonate or the like, phosphates such as trimethyl phosphate, or the like, or combinations including at least one of the foregoing heat stabilizers. Heat stabilizers can generally be used in amounts of from 0.01 to 0.5 parts by weight based on 100 parts by weight of the total composition, excluding any filler.

In further aspects, light stabilizers can be present in the thermoplastic composition. Exemplary light stabilizers can include, for example, benzotriazoles such as 2-(2-hydroxy-5-methylphenyl)benzotriazole, 2-(2-hydroxy-5-tert-octylphenyl)-benzotriazole and 2-hydroxy-4-n-octoxy benzophenone or the like or combinations including at least one of the foregoing light stabilizers. Light stabilizers can generally be used in amounts of from about 0.1 to about 1.0 parts by weight, based on 100 parts by weight of the total composition, excluding any filler.

The thermoplastic composition can also comprise plasticizers. For example, plasticizers can include phthalic acid esters such as dioctyl-4,5-epoxy-hexahydrophthalate, tris-(octoxycarbonylethyl)isocyanurate, tristearin, epoxidized soybean oil or the like, or combinations including at least one of the foregoing plasticizers. Plasticizers are generally used in amounts of from about 0.5 to about 3.0 parts by weight, based on 100 parts by weight of the total composition, excluding any filler.

In further aspects, the disclosed composition can comprise antistatic agents. These antistatic agents can include, for example, glycerol monostearate, sodium stearyl sulfonate, sodium dodecylbenzenesulfonate or the like, or combinations of the foregoing antistatic agents. In one aspect, carbon fibers, carbon nanofibers, carbon nanotubes, carbon black, or any combination of the foregoing can be used in a polymeric resin containing chemical antistatic agents to render the composition electrostatically dissipative.

Ultraviolet (UV) absorbers can also be present in the disclosed thermoplastic composition. Exemplary ultraviolet absorbers can include for example, hydroxybenzophenones; hydroxybenzotriazoles; hydroxybenzotriazines; cyanoacrylates; oxanilides; benzoxazinones; 2-(2H-benzotriazol-2-yl)-4-(1,1,3,3-tetramethylbutyl)-phenol (CYASORB™ 5411); 2-hydroxy-4-n-octyloxybenzophenone (CYASORB™ 531); 2-[4,6-bis(2,4-dimethylphenyl)-1,3,5-triazin-2-yl]-5-(octyloxy)-phenol (CYASORB™ 1164); 2,2'-(1,4-phenylene)bis(4H-3,1-benzoxazin-4-one) (CYASORB™ UV-3638); 1,3-bis[[(2-cyano-3,3-diphenylacryloy)oxy]-2,2-bis[[(2-cyano-3,3-diphenylacryloy)oxy]methyl]propane (UVINUL™ 3030); 2,2'-(1,4-phenylene)bis(4H-3,1-benzoxazin-4-one); 1,3-bis[(2-cyano-3,3-diphenylacryloyl)oxy]-2,2-bis[[(2-cyano-3,3-diphenylacryloyl)oxy]methyl]propane; nano-size inorganic materials such as titanium oxide, cerium oxide, and zinc oxide, all with particle size less than 100 nanometers; or the like, or combinations including at least one of the foregoing UV absorbers. UV absorbers are generally used in amounts of from 0.01 to 3.0 parts by weight, based on 100 parts by weight of the total composition, excluding any filler.

The thermoplastic composition can further comprise a lubricant. As an example, lubricants can include for example, fatty acid esters such as alkyl stearyl esters, e.g., methyl stearate or the like; mixtures of methyl stearate and hydrophilic and hydrophobic surfactants including polyethylene glycol polymers, polypropylene glycol polymers, and copolymers thereof e.g., methyl stearate and polyethylene-polypropylene glycol copolymers in a suitable solvent; or combinations including at least one of the foregoing lubricants. Lubricants can generally be used in amounts of from about 0.1 to about 5 parts by weight, based on 100 parts by weight of the total composition, excluding any filler.

Anti-drip agents can also be used in the composition, for example a fibril forming or non-fibril forming fluoropolymer such as polytetrafluoroethylene (PTFE). The anti-drip agent can be encapsulated by a rigid copolymer, for example styrene-acrylonitrile copolymer (SAN). PTFE encapsulated in SAN is known as TSAN. In one example, TSAN can comprise 50 wt. % PTFE and 50 wt. % SAN, based on the total weight of the encapsulated fluoropolymer. The SAN can comprise, for example, 75 wt. % styrene and 25 wt. % acrylonitrile based on the total weight of the copolymer. An antidrip agent, such as TSAN, can be used in amounts of 0.1 to 10 parts by weight, based on 100 parts by weight of the total composition, excluding any filler.

As an example, the disclosed composition may comprise an impact modifier. The impact modifier can be a chemically reactive impact modifier. By definition, a chemically reactive impact modifier can have at least one reactive group such that when the impact modifier is added to a polymer composition, the impact properties of the composition (expressed in the values of the Izod impact) are improved. In some examples, the chemically reactive impact modifier can be an ethylene copolymer with reactive functional groups selected from, but not limited to, anhydride, carboxyl, hydroxyl, and epoxy.

In further aspects of the present disclosure, the composition can comprise a rubbery impact modifier. The rubber impact modifier can be a polymeric material which, at room temperature, is capable of recovering substantially in shape and size after removal of a force. However, the rubbery impact modifier should typically have a glass transition temperature of less than 0° C. In certain aspects, the glass transition temperature (Tg) can be less than −5° C., −10° C., −15° C., with a Tg of less than −30° C. typically providing better performance. Representative rubbery impact modifiers can include, for example, functionalized polyolefin ethylene-acrylate terpolymers, such as ethylene-acrylic esters-maleic anhydride (MAH) or glycidyl methacrylate (GMA). The functionalized rubbery polymer can optionally contain repeat units in its backbone which are derived from an anhydride group containing monomer, such as maleic anhydride. In another scenario, the functionalized rubbery polymer can contain anhydride moieties which are grafted onto the polymer in a post polymerization step.

The composition may comprise a core-shell copolymer impact modifier having about 80 wt. % of a core comprising poly(butyl acrylate) and about 20 wt. % of a shell comprising poly(methyl methacrylate). In a further example, the impact modifier can comprise an acrylic impact modifier such as ethylene-ethylacrylate copolymer with an ethyl acrylate content of less than 20 wt. % (such as EXL 3330 as supplied by SABIC). The composition can comprise about 5 wt. % of the ethylene-ethylacrylate copolymer.

In certain examples, the composition may comprise an impact modifier comprising a styrene-based copolymer selected from the group consisting of styrene ethylene butylene styrene copolymer (SEBS), styrene butadiene styrene (SBS), styrene ethylene propylene styrene (SEPS) and combinations thereof.

An impact modifier may be present in an amount of from about 5 wt. % to about 30 wt. % based on the composition. For example, the impact modifier may be present in an amount from about 5 wt. % to about 25 wt. %, from about 5 wt. % to about 20 wt. %, or from about 5 wt. % to about 15 wt. %.

Methods

In many aspects, the compositions can be prepared according to a variety of methods. The compositions of the present disclosure can be blended, compounded, or otherwise combined with the aforementioned ingredients by a variety of methods involving intimate admixing of the materials with any additional additives desired in the formulation. Because of the availability of melt blending equipment in commercial polymer processing facilities, melt processing methods can be used. In various further aspects, the equipment used in such melt processing methods can include, but is not limited to, co-rotating and counter-rotating extruders, single screw extruders, co-kneaders, disc-pack processors and various other types of extrusion equipment. In a further aspect, the extruder is a twin-screw extruder. In various further aspects, the composition can be processed in an extruder at temperatures from about 180° C. to about 350° C., particularly 250° C. to 300° C.

A method of forming the disclosed composition may comprise combining: a polymer base resin comprising a polyarylene ether, a polystyrene, a polypropylene, or a combination thereof, a thermally conductive filler, and a dielectric ceramic filler.

Properties and Articles

Thermal conductive thermoplastic compositions with high Dk and low Df properties have been developed based on of the components PPO, SEBS, PS, and inorganic fillers including thermal conductive fillers and dielectric ceramics. The compositions showed desirable mechanical and processing properties. Thermal conductivity (TC) and dielectric constant (Dk) of the compositions may be tunable (through plane TC>0.4 W/(m·K), Dk from 3-8 at 1.1 to 5 GHz) by altering the filler loading and the type of filler. The present compositions maintained a low dissipation factor (Df), that is, Df<0.002 at 1.1-5 GHz.

Compositions of the present disclosure may exhibit a dielectric constant (Dk) greater than 3.5 at 1.1 GHz when tested using a split post dielectric resonator and network analyzer on a sample size of 120 mm by 120 mm and 6 mm thickness and a dissipation factor (Df) of less than 0.001 at 1.1 GHz when tested using a split post dielectric resonator and network analyzer on a sample size of 120 mm by 120 mm and 6 mm thickness. Compositions of the present disclosure may exhibit a dielectric constant (Dk) greater than 3.0 at 1.1 GHz when tested using a split post dielectric resonator and network analyzer on a sample size of 120 mm by 120 mm and 6 mm thickness and a dissipation factor (Df) of less than 0.002 at 1.1 GHz when tested using a split post dielectric resonator and network analyzer on a sample size of 120 mm by 120 mm and 6 mm thickness.

In certain aspects, the compositions may exhibit desirable thermal conductivity properties. For example, in some aspects the compositions may exhibit a through plane thermal conductivity of at least about 0.4 W/mK when tested in accordance with ASTM E1461. In other aspects the compositions can exhibit a through plane thermal conductivity of at least 0.45 W/mK when tested in accordance with ASTM E1461. In further examples, the compositions may exhibit an in-plane thermal conductivity of at least about 1 W/mK when tested in accordance with ASTM E1461. In other aspects the compositions can exhibit a through plane thermal conductivity of at least 1.25 W/mK when tested in accordance with ASTM E1461, or at least about 1.5 W/mK, or at least about 2 W/mK, or at least about 2.5 W/mK when tested in accordance with ASTM E1461.

In various aspects, the present disclosure relates to articles comprising the compositions herein. The compositions can be molded into useful shaped articles by a variety of means such as injection molding, extrusion, rotational molding, blow molding and thermoforming to form articles. The compositions can be useful in the manufacture of articles requiring materials with high modulus, good flow, good impact strength, thermal conductivity, and reflectivity.

The advantageous characteristics of the compositions disclosed herein can make them appropriate for an array of uses. Formed articles can include, but are not limited to, personal computers, notebook and portable computers, cell phone antennas and other such communications equipment, medical applications, radio frequency identification (RFID) applications, automotive applications, and the like. In various further aspects, the article can be appropriate as a computer and business machine housing such as a housing for high end laptop personal computers, monitors, robotics, a hand held electronic device housing (such as a housing or flash holder for smart phones, tablets, music devices), electrical connectors, LED heat sink, and components of lighting fixtures, wearables, ornaments, home appliances, and the like.

In a further aspect, non-limiting examples of fields in which the thermoplastic compositions can be employed can include electrical, electro-mechanical, radio frequency (RF) technology, telecommunication, automotive, aviation, medical, sensor, military, and security. In a still further aspect, the thermoplastic compositions can also be present in overlapping fields, such as mechatronic systems that integrate mechanical and electrical properties which can, for example, be used in automotive or medical engineering.

In a further aspect, the suitable article can be an electronic device, automotive device, telecommunication device, medical device, security device, or mechatronic device. In a still further aspect, the article can be selected from a computer device, electromagnetic interference device, printed circuit, Wi-Fi device, Bluetooth device, GPS device, cellular antenna device, smart phone device, automotive device, medical device, sensor device, security device, shielding device, RF antenna device, LED device, and RFID device. In yet a further aspect, the article can be selected from a computer device, sensor device, security device, RF antenna device, LED device and RFID device.

In a further aspect, the molded articles can be used to manufacture devices in the automotive field. In a still further aspect, non-limiting examples of such devices in the automotive field which can use the disclosed blended thermoplastic compositions in the vehicle's interior include adaptive cruise control, headlight sensors, windshield wiper sensors, and door/window switches. In a further aspect, non-limiting examples of devices in the automotive field which can the disclosed blended thermoplastic compositions in the vehicle's exterior include pressure and flow sensors for engine management, air conditioning, crash detection, and exterior lighting fixtures.

In a further aspect, the resulting disclosed compositions can be used to provide any desired shaped, formed, or molded articles. For example, the disclosed compositions can be molded into useful shaped articles by a variety of means such as injection molding, extrusion, rotational molding, blow molding and thermoforming. As noted above, the disclosed compositions are particularly well suited for use in the manufacture of electronic components and devices. As such, according to some aspects, the disclosed compositions can be used to form articles such as printed circuit board carriers, burn in test sockets, flex brackets for hard disk drives, and the like.

ASPECTS

Aspect 1. A polymer composition comprising, consisting of, or consisting essentially of: from about 20 wt. % to about 80 wt. % of a polymer base resin; from about 8 wt. % to about 60 wt. % of a thermally conductive filler; and from about 5 wt. % to about 60 wt. % of a dielectric ceramic filler having a Dk of at least 20 when measured at 1.1 GHz or greater, wherein the polymer composition exhibits a dielectric constant greater than 3.0 at 1.1 GHz when tested using a split post dielectric resonator and network analyzer on a sample size of 120 mm by 120 mm and 6 mm thickness according to ASTM D150, wherein the polymer composition exhibits a dissipation factor of less than 0.002 at 1.1 GHz when tested using a split post dielectric resonator and network analyzer on a sample size of 120 mm by 120 mm and 6 mm thickness according to ASTM D150, and wherein the combined weight percent value of all components does not exceed about 100 wt. %, and all weight percent values are based on the total weight of the composition.

Aspect 2. A polymer composition comprising, consisting of, or consisting essentially of: from about 20 wt. % to about 80 wt. % of a polymer base resin; from about 10 wt. % to about 60 wt. % of a thermally conductive filler; and from about 5 wt. % to about 60 wt. % of a dielectric ceramic filler having a Dk of at least 20 when measured at 1.1 GHz or greater, wherein the polymer composition exhibits a dielectric constant greater than 3.0 at 1.1 GHz when tested using a split post dielectric resonator and network analyzer on a sample size of 120 mm by 120 mm and 6 mm thickness according to ASTM D150, wherein the polymer composition exhibits a dissipation factor of less than 0.002 at 1.1 GHz when tested using a split post dielectric resonator and network analyzer on a sample size of 120 mm by 120 mm and 6 mm thickness according to ASTM D150, and wherein the combined weight percent value of all components does not exceed about 100 wt. %, and all weight percent values are based on the total weight of the composition.

Aspect 3. The polymer composition of any of aspects 1-2, wherein the polymer base resin comprises a polyarylene ether, a polypropylene, a polystyrene or a combination thereof.

Aspect 4. A polymer composition comprising, consisting of, or consisting essentially of: from about 20 wt. % to about 80 wt. % of a polymer base resin comprising a polyarylene ether, a polystyrene, a polypropylene, or a combination thereof; from about 10 wt. % to about 60 wt. % of a thermally conductive filler; and from about 5 wt. % to about 60 wt. % of a dielectric ceramic filler, wherein the polymer composition exhibits a dielectric constant greater than 3.0 at 1.1 GHz when tested using a split post dielectric resonator and network analyzer on a sample size of 120 mm by 120 mm and 6 mm thickness according to ASTM D150, wherein the polymer composition exhibits a dissipation factor of less than 0.002 at 1.1 GHz when tested using a split post dielectric resonator and network analyzer on a sample size of 120 mm by 120 mm and 6 mm thickness according to ASTM D150, and wherein the combined weight percent value of all components does not exceed about 100 wt. %, and all weight percent values are based on the total weight of the composition.

Aspect 5. The polymer composition of any of aspects 1-4, wherein the dielectric ceramic filler has a Dk of at least 20 when measured at 1.1 GHz or greater.

Aspect 6. The polymer composition of any one of aspects 1-5, further comprising from about 5 wt. % to about 30 wt. % of an impact modifier.

Aspect 7. A polymer composition comprising, consisting of, or consisting essentially of: from about 20 wt. % to about 80 wt. % of a polymer base resin comprising a polyarylene ether, a polystyrene, a polypropylene, or a combination thereof; from about 10 wt. % to about 60 wt. % of a thermally conductive filler; from about 5 wt. % to about 60 wt. % of a dielectric ceramic filler; and from about 5 wt. % to about 30 wt. % of an impact modifier, wherein the polymer composition exhibits a dielectric constant greater than 3.0 at 1.1 GHz when tested using a split post dielectric resonator and network analyzer on a sample size of 120 mm by 120 mm and 6 mm thickness according to ASTM D150, wherein the polymer composition exhibits a dissipation factor of less than 0.002 at 1.1 GHz when tested using a split post dielectric resonator and network analyzer on a sample size of 120 mm by 120 mm and 6 mm thickness according to ASTM D150, and wherein the combined weight percent value of all components does not exceed about 100 wt. %, and all weight percent values are based on the total weight of the composition.

Aspect 8. The polymer compositions of any one of aspects 1-7, wherein the polymer composition exhibits a dissipation factor at 1.1 GHz that is less than that of a substantially similar polymer composition in the absence a thermally conductive filler when tested using a split post dielectric resonator and network analyzer on a sample size of 120 mm by 120 mm and 6 mm thickness according to ASTM D150.

Aspect 9. The polymer composition of any one of aspects 1-8, wherein the polymer composition exhibits a dissipation factor that is less than 0.002 at 1.9 GHz when tested using a split post dielectric resonator and network analyzer on a sample size of 120 mm by 120 mm and 6 mm thickness according to ASTM D150.

Aspect 10. The polymer composition of any of aspects 1-9, wherein the thermally conductive filler comprises zinc sulfide, calcium oxide, magnesium oxide, zinc oxide, titanium dioxide, tin dioxide, chromium oxide, calcium carbonate, mica, barium oxide, barium sulfate, calcium sulfate, wollastonite, zirconium oxide, silicon oxide, glass beads, glass fiber, magnesium aluminate, dolomite, coated graphite, magnesium hydroxide, talc, boehmite, diaspore, gibbsite, clay; aluminum nitride, aluminum carbide, aluminum oxide, boron nitride, aluminum oxynitride, magnesium silicon nitride, silicon carbide, silicon nitride, tungsten oxide, aluminum phosphide, beryllium oxide, boron phosphide, cadmium sulfide, gallium nitride, zinc silicate, tungsten oxide or a combination thereof.

Aspect 11. The polymer composition of any one of aspects 1-9, wherein the thermally conductive filler comprises boron nitride.

Aspect 12. The polymer composition of any of aspects 1-9, wherein the thermally conductive filler comprises one or more of magnesium hydroxide and boron nitride or a combination thereof.

Aspect 13. The polymer composition of any one of aspects 19, wherein the thermally conductive filler comprises talc.

Aspect 14. The composition of any of aspects 1-13, wherein the thermally conductive filler has a thermal conductivity of at least about 5 W/m*K.

Aspect 15. The polymer composition of any of aspects 1-14, wherein the dielectric ceramic filler comprises barium titanate, titanium dioxide, boron nitride, silicon carbide, silicon nitride, zinc oxide, or a combination thereof.

Aspect 16. The composition of any one of aspects 1-15, wherein the dielectric ceramic filler comprises inorganic oxides, silicates, or a combination thereof.

Aspect 17. The polymer composition of any one of aspects 6-16, wherein the impact modifier comprises a styrene-based copolymer.

Aspect 18. The polymer composition of any one of aspects 6-16, wherein the impact modifier comprises a styrene-based copolymer selected from the group consisting of styrene ethylene butylene styrene copolymer (SEBS), styrene butadiene styrene (SBS), styrene ethylene propylene styrene (SEPS) and combinations thereof.

Aspect 19. The polymer composition of any of aspects 6-16, wherein the composition further comprises an additive.

Aspect 20. The polymer composition of aspect 19, wherein the additive comprises a pigment, a dye, a filler, a plasticizer, a fiber, a flame retardant, an antioxidant, a lubricant, wood, glass, metal, an ultraviolet agent, an antistatic agent, an anti-microbial agent, or combinations thereof.

Aspect 21. An article comprising the polymer composition of any of aspects 1-20.

Aspect 22. The article of aspect 21, wherein the article is a component of an electronic device.

Aspect 23. A method of forming a polymer composition comprising, consisting of, or consisting essentially of: combining: a polymer base resin comprising a polyarylene ether, a polystyrene, a polypropylene, or a combination thereof; a thermally conductive filler; and a dielectric ceramic filler, wherein the polymer composition exhibits a dielectric constant greater than 3.5 at 1.1 GHz when tested using a split post dielectric resonator and network analyzer on a sample size of 120 mm by 120 mm and 6 mm thickness according to ASTM D150, wherein the polymer composition exhibits a dissipation factor of less than 0.001 at 1.1 GHz when tested using a split post dielectric resonator and network analyzer on a sample size of 120 mm by 120 mm and 6 mm thickness according to ASTM D150, and wherein the combined weight percent value of all components does not exceed about 100 wt. %, and all weight percent values are based on the total weight of the composition.

Aspect 24. A polymer composition comprising, consisting of, or consisting essentially of: from about 20 wt. % to about 80 wt. % of a polyarylene ether resin; from about 10 wt. % to about 60 wt. % of a thermally conductive filler; from about 5 wt. % to about 60 wt. % of a dielectric ceramic filler having a Dk of at least 20 when measured at 1.1 GHz or greater, and from about 5 wt. % to about 30 wt. % of an impact modifier, wherein the polymer composition exhibits a dielectric constant greater than 3.0 at 1.1 GHz when tested using a split post dielectric resonator and network analyzer on a sample size of 120 mm by 120 mm and 6 mm thickness according to ASTM D150, wherein the polymer composition exhibits a dissipation factor of less than 0.002 at 1.1 GHz when tested using a split post dielectric resonator and network analyzer on a sample size of 120 mm by 120 mm and 6 mm thickness according to ASTM D150, and wherein the combined weight percent value of all components does not exceed about 100 wt. %, and all weight percent values are based on the total weight of the composition.

EXAMPLES

Detailed aspects of the present disclosure are disclosed herein; it is to be understood that the disclosed aspects are merely exemplary of the disclosure that may be embodied in various forms. Therefore, specific structural and functional details disclosed herein are not to be interpreted as limits, but merely as a basis for teaching one skilled in the art to employ the present disclosure. The specific examples below will enable the disclosure to be better understood. However, they are given merely by way of guidance and do not imply any limitation.

The following examples are provided to illustrate the compositions, processes, and properties of the present disclosure. The examples are merely illustrative and are not intended to limit the disclosure to the materials, conditions, or process parameters set forth therein.

Definitions

It is also to be understood that the terminology used herein is for the purpose of describing particular aspects only and is not intended to be limiting. As used in the specification and in the claims, the term "comprising" can include the aspects "consisting of" and "consisting essentially of." Unless defined otherwise, all technical and scientific terms used herein have the same meaning as commonly understood by one of ordinary skill in the art to which this disclosure belongs. In this specification and in the claims which follow, reference will be made to a number of terms which shall be defined herein.

As used in the specification and the appended claims, the singular forms "a," "an" and "the" include plural referents unless the context clearly dictates otherwise. Thus, for example, reference to "a polymeric base resin" includes mixtures of two or more polymeric base resins.

As used herein, the term "combination" is inclusive of blends, mixtures, alloys, reaction products, and the like.

Ranges can be expressed herein as from one particular value, and/or to another particular value. When such a range is expressed, another aspect includes from the one particular value and/or to the other particular value. Similarly, when values are expressed as approximations, by use of the antecedent 'about,' it will be understood that the particular value forms another aspect. It will be further understood that the endpoints of each of the ranges are significant both in relation to the other endpoint, and independently of the other endpoint. It is also understood that there are a number of values disclosed herein, and that each value is also herein disclosed as "about" that particular value in addition to the value itself. For example, if the value "10" is disclosed, then "about 10" is also disclosed. It is also understood that each unit between two particular units are also disclosed. For example, if 10 and 15 are disclosed, then 11, 12, 13, and 14 are also disclosed.

As used herein, the terms "about" and "at or about" mean that the amount or value in question can be the value designated some other value approximately or about the same. It is generally understood, as used herein, that it is the nominal value indicated ±10% variation unless otherwise indicated or inferred. The term is intended to convey that similar values promote equivalent results or effects recited in the claims. That is, it is understood that amounts, sizes, formulations, parameters, and other quantities and characteristics are not and need not be exact, but can be approximate and/or larger or smaller, as desired, reflecting tolerances, conversion factors, rounding off, measurement error and the like, and other factors known to those of skill in the art. In general, an amount, size, formulation, parameter or other quantity or characteristic is "about" or "approximate" whether or not expressly stated to be such. It is understood that where "about" is used before a quantitative value, the parameter also includes the specific quantitative value itself, unless specifically stated otherwise.

As used herein, the terms "optional" or "optionally" means that the subsequently described event or circumstance can or cannot occur, and that the description includes instances where said event or circumstance occurs and instances where it does not. For example, the phrase "optional additive materials" means that the additive materials can or cannot be included and that the description includes thermoplastic compositions that both include and that do not include additive materials.

Disclosed are the components to be used to prepare the compositions of the disclosure as well as the compositions themselves to be used within the methods disclosed herein. These and other materials are disclosed herein, and it is understood that when combinations, subsets, interactions, groups, etc. of these materials are disclosed that while specific reference of each various individual and collective combinations and permutation of these compounds cannot be explicitly disclosed, each is specifically contemplated and described herein. For example, if a particular compound is disclosed and discussed and a number of modifications that can be made to a number of molecules including the compounds are discussed, specifically contemplated is each and every combination and permutation of the compound and the modifications that are possible unless specifically indicated to the contrary. Thus, if a class of molecules A, B, and C are disclosed as well as a class of molecules D, E, and F and an example of a combination molecule, A-D is disclosed, then even if each is not individually recited each is individually and collectively contemplated meaning combinations, A-E, A-F, B-D, B-E, B-F, C-D, C-E, and C-F are considered disclosed. Likewise, any subset or combination of these is also disclosed. Thus, for example, the sub-group of A-E, B-F, and C-E would be considered disclosed. This concept applies to all aspects of this application including, but not limited to, steps in methods of making and using the compositions of the disclosure. Thus, if there are a variety of additional steps that can be performed it is understood that each of these additional steps can be performed with any specific aspect or combination of aspects of the methods of the disclosure.

References in the specification and concluding claims to parts by weight of a particular element or component in a composition or article, denotes the weight relationship between the element or component and any other elements or components in the composition or article for which a part by weight is expressed. Thus, in a compound containing 2 parts by weight of component X and 5 parts by weight component Y, X and Y are present at a weight ratio of 2:5, and are present in such ratio regardless of whether additional components are contained in the compound.

A weight percent of a component, unless specifically stated to the contrary, is based on the total weight of the formulation or composition in which the component is included.

As used herein the terms "weight percent," "wt %," and "wt. %," which can be used interchangeably, indicate the percent by weight of a given component based on the total weight of the composition, unless otherwise specified. That is, unless otherwise specified, all wt. % values are based on the total weight of the composition. It should be understood that the sum of wt. % values for all components in a disclosed composition or formulation are equal to 100.

Certain abbreviations are defined as follows: "g" is grams, "kg" is kilograms, "° C." is degrees Celsius, "min" is minutes, "mm" is millimeter, "MPa" is megapascal, "WiFi" is a system of accessing the internet from remote machines, 3G and 4G refer to mobile communications standards that allow portable electronic devices to access the Internet wirelessly, "GPS" is Global Positioning System—a global system of U.S. navigational satellites which provide positional and velocity data. "LED" is light-emitting diode, "RF" is radio frequency, and "RFID" is radio frequency identification.

The term "polypropylene" as used in this application is meant to refer to propylene homopolymer or propylene copolymer or a mixture of such propylene homopolymers and propylene copolymers.

Accordingly, the term "polypropylene homopolymer" as used in this application is meant to refer to a polypropylene that consists substantially, i.e. of 97% or more by weight of the polymer of propylene units, or 98% or more, or 99% or more, or even 99.5% or more. In a one example, only propylene units in the propylene homopolymer are detectable. The comonomer content may be determined with Fourier Transform infrared spectroscopy.

Unless otherwise stated to the contrary herein, all test standards are the most recent standard in effect at the time of filing this application.

Each of the materials disclosed herein are either commercially available and/or the methods for the production thereof are known to those of skill in the art.

It is understood that the compositions disclosed herein have certain functions. Disclosed herein are certain structural requirements for performing the disclosed functions and it is understood that there are a variety of structures that can perform the same function that are related to the disclosed structures, and that these structures will typically achieve the same result.

General Materials and Methods

The components and additives presented in Table 1 were used to prepare compositions according to aspects of the present disclosure and examples to be used for comparison to molded articles according to aspects of the disclosure.

TABLE 1

Components of the compositions.

| Component | Item Description | Unit | C1.1 | E1.1 | E1.2 |
|---|---|---|---|---|---|
| PPO | Poly(p-phenylene oxide), 0.40 dl/g intrinsic viscosity (IV) | % | 36.7 | 36.7 | 36.7 |
| $IM_{low}$ | Styrene ethylene butylene styrene copolymer (SEBS) from KRATON ™ SEBS G1652, low viscosity (melt Index higher than 3g/10 min at 230° C./5kg); impact modifier | % | 8 | 8 | 8 |
| GPPS | General purpose polystyrene (atactic polystyrene) | % | 14 | 14 | 14 |
| $TiO_2$ | Bright white $TiO_2$ pigment as ceramic filler | % | 40 | 30 | 20 |
| BNHN | Boron nitride BNHN from Dandong | % | | 10 | 20 |
| LLDPE | Linear low density polyethylene | % | 1 | 1 | 1 |
| MAGOX | Magnesium oxide | % | 0.1 | 0.1 | 0.1 |
| ZnS | Zinc sulfide | % | 0.1 | 0.1 | 0.1 |
| STAB1 | Phosphite Stabilizer | % | 0.1 | 0.1 | 0.1 |

Formulations were prepared by extruding the pre-blended components using a twin extruder. The polymer baste resin, thermally conductive fillers, white pigment, optical brightening agents and any additional additives were first dry blended together, then fed into a The extrudate was cooled using a water bath prior to pelletizing. Components were compounded using an L/D at 40.5 Toshiba™ TEM-37BS Twin Screw Extruder co-rotating twin screw extruder with extrusion settings presented in Table 2.

TABLE 2

Extrusion Conditions.

| Parameters | Unit | Extrusion Condition |
|---|---|---|
| Compounder Type | NONE | TEM-37BS |
| Barrel Size | Mm | 1500 |
| Die | Mm | 4 |
| Zone 1 Temp | °C. | 90 |
| Zone 2 Temp | °C. | 150 |
| Zone 3 Temp | °C. | 280 |
| Zone 4 Temp | °C. | 280 |
| Zone 5 Temp | °C. | 280 |
| Zone 6 Temp | °C. | 280 |
| Zone 7 Temp | °C. | 280 |
| Zone 8 Temp | °C. | 290 |
| Zone 9 Temp | °C. | 290 |
| Zone 10 Temp | °C. | 290 |
| Zone 11 Temp | °C. | 290 |
| Die Temp | °C. | 290 |
| Screw speed | Rpm | 300 |
| Throughput | kg/hr | 30 |
| Torque | NONE | 50-60 |
| Vacuum 1 | MPa | −0.08 |
| Side Feeder 1 speed | Rpm | 250 |
| Melt temperature | NONE | 280-290 |

The pellets obtained from extrusion were then injection molded using 150 T injection molding machine at a melt temperature of 280° C. and a mold temperature of 80° C. The injection molding profile is presented in Table 3.

TABLE 3

Injection molding profile.

| Parameters | Unit | Molding Condition |
|---|---|---|
| Cnd: Pre-drying time | Hour | 3 |
| Cnd: Pre-drying temp | °C. | 105 |
| Molding Machine | NONE | FANUC, UH1000-110 |
| Mold Type (insert) | NONE | ASTM Tensile, Flexural, Izod bars, 90*50*2.54 mm Color Chips, 2.0 & 1.5 & 1.0 mm thickness UL bars |
| Hopper temp | °C. | 50 |
| Zone 1 temp | °C. | 270-280 |
| Zone 2 temp | °C. | 280-290 |
| Zone 3 temp | °C. | 290-300 |
| Nozzle temp | °C. | 280-290 |
| Mold temp | °C. | 90-120 |
| Screw speed | rpm | 100 |
| Back pressure | kgf/cm$^2$ | 90 |
| Cooling time | s | 15-30 |
| Injection speed | mm/s | 25-500 |
| Holding pressure | kgf/cm$^2$ | 600-1000 |
| Max. Injection pressure | kgf/cm$^2$ | 1000-2500 |

Molded samples were tested in accordance with the standards described herein. Comparative sample C1.1 was prepared to assess the performance of formulations comprising titanium dioxide in a polyamide base resin matrix using boronitride and magnesium hydroxide as the thermally conductive filler. Properties of the compositions are presented in Table 4.

TABLE 4

Properties of the compositions

| Typical Property | Test Method | Test Description | Unit | C1.1 | E1.1 | E1.2 |
|---|---|---|---|---|---|---|
| Density | Specific Gravity | ASTM D792 | g/cm$^3$ | 1.489 | 1.441 | 1.412 |
| MVR | 300° C./ 5.0 kg | ASTM D1238 | cm$^3$/10 min | 13.1 | 11.1 | 8.8 |
| Notched IZOD | 23° C., 5 lbf/ft | ASTM D256 | J/m | 139 | 71 | 53 |
| Unnotched IZOD | 23° C., 5 lbf/ft | ASTM D256 | J/m | 1560 | 373 | 355 |
| HDT | 1.82 MPa/ 3.2 mm | ASTM D648 | °C. | 141 | 142 | 145 |
| HDT | 0.45 MPa/ 3.2 mm | ASTM D648 | °C. | 157 | 159 | 161 |
| Flexural Modulus | 3.2 mm, 1.27 mm/min | ASTM D790 | MPa | 2630 | 3050 | 3760 |
| Flexural Strength | at break, 3.2 mm, 1.27 mm/min | ASTM D790 | MPa | 82 | 77 | 82 |
| Tensile Modulus | 5 mm/min | ASTM D638 | MPa | 2800 | 3410 | 4620 |
| Tensile Strength | at break, 5 mm/min | ASTM D638 | MPa | 42 | 44 | 47 |
| Tensile Elongation | at break, 5 mm/min | ASTM D638 | % | 9.4 | 5.5 | 3.0 |
| Dk | 1.1 GHz | SABIC Method | / | 4.20 | 3.87 | 3.59 |
| Df | 1.1 GHz | SABIC Method | / | 0.00111 | 0.00079 | 0.00075 |
| Dk | 1.9 GHz | SABIC Method | / | 4.21 | 3.86 | 3.62 |

TABLE 4-continued

Properties of the compositions

| Typical Property | Test Method | Test Description | Unit | C1.1 | E1.1 | E1.2 |
|---|---|---|---|---|---|---|
| Df | 1.9 GHz | SABIC Method | / | 0.00151 | 0.00096 | 0.00086 |
| Dk | 5.0 GHz | SABIC Method | / | 4.20 | 3.88 | 3.63 |
| Df | 5.0 GHz | SABIC Method | / | 0.00193 | 0.00132 | 0.00126 |
| Thermal Conductivity | Through plane | ASTM E1461 | W/(m · K) | 0.32 | 0.49 | 0.61 |
| Thermal Conductivity | In plane | ASTM E1461 | W/(m · K) | 0.96 | 1.50 | 2.25 |

Thermal conductivity was determined in accordance with ASTM E-1461. Through plane Thermal conductivity (TC) was measured for extruded pellets injection molded into 80 mm by 10 mm by 3 mm bar cut into 10 mm by 10 mm by 3 mm square samples. In plane thermal conductivity was measured on 100 mm by 0.4 mm sheet cut into 25 by 0.4 mm round samples. Thermal diffusivity ($\alpha$, cm$^2$/s), specific heat (Cp/J/g-K), and density ($\rho$, g/m$^3$, according to ASTM D792 using a water immersion method) are also observed. The product of the three values provide the through plane and in plane direction thermal conductivity according to the equation $\kappa = \alpha(T)Cp(T)\rho(T)$. Each component was measured three times for accuracy.

The notched Izod impact ("NII") test was carried out in accordance with ASTM D256 on 63.5 mm×12.7 mm×3.2 mm molded samples (bars) at 25° C. Data units are J/m.

The unnotched Izod impact ("UNII") test was performed in accordance with ASTM D4812 on 63.5 mm×12.7 mm×3.2 mm molded samples (bars) at 25° C. Data units are J/m.

Heat deflection temperature was determined per ASTM D790 with flatwise specimen orientation with a 3.18 mm thick specimen (127 mm×12.7 mm) at 1.82 MPa. Data are provided below in units of ° C.

Tensile properties were measured with a Tensile Type 1 bar in accordance with ASTM D638 using sample bars prepared in accordance with a (bars having the following dimensions 57 mm×13 mm×3.18 mm×166 mm). Tensile strength for either at break or at yield are reported in units of MPa.

The melt volume rate (MVR) was determined according to ASTM 1238 at 6.7 kilogram (kg) at 285° C. for 6 minutes and 18 minutes (more abusive conditions).

SABIC Method means Dk, Df were measured using internal method with QWED split post dielectric resonator and Agilent PNA network analyzer.

For 1.1 GHz measurement, minimum sample size is 120 mm*120 mm, maximum sample thickness is 6 mm.

For 1.9 GHz measurement, minimum sample size is 70 mm*70 mm, maximum sample thickness is 4 mm.

For 5.0 GHz measurement, minimum sample size is 30 mm*30 mm, maximum sample thickness is 2 mm.

The dielectric constant and dissipation factor were determined using the SABIC Method QWED split post dielectric resonator and Agilent PNA network analyzer according to ASTM D150. For 1.1 GHz measurement, minimum sample size is 120 mm*120 mm, maximum sample thickness is 6 mm. For 1.9 GHz measurement, minimum sample size is 70 mm*70 mm, maximum sample thickness is 4 mm. For 5.0 GHz measurement, minimum sample size is 30 mm*30 mm, maximum sample thickness is 2 mm.

Formulations with higher inorganic filler loading are shown in Table 5:

TABLE 5

| Item Code | | Unit | E2.1 | E2.2 | E2.3 |
|---|---|---|---|---|---|
| PPO | Poly(p-phenylene oxide), 0.40 dl/g intrinsic viscosity (IV) Poly(p-phenylene oxide), 0.40 dl/g intrinsic viscosity (IV) | % | 18.7 | 18.7 | 18.7 |
| IM$_{low}$ | Styrene ethylene butylene styrene copolymer (SEBS) from KRATON ™ SEBS G1652, low viscosity (melt Index higher than 3g/10 min at 230° C./5kg); impact modifier | % | 6 | 6 | 6 |
| GPPS | General purpose polystyrene (atactic polystyrene) | % | 14 | 14 | 14 |
| TiO$_2$ | Bright white TiO$_2$ pigment as ceramic filler | % | 40 | 30 | 30 |
| BNHN | Boron nitride BNHN from Dandong | % | 20 | 30 | |
| Talc | Talc from Hayashi Kasei | % | | | 30 |
| LLDPE | Linear low density polyethylene | % | 1 | 1 | 1 |
| MAGOX | Magnesium oxide | % | 0.1 | 0.1 | 0.1 |
| ZnS | Zinc sulfide | % | 0.1 | 0.1 | 0.1 |
| STAB1 | Phosphite Stabilizer | % | 0.1 | 0.1 | 0.1 |

Thermal conductivity, dielectric and physical performance of the developed thermal conductive high Dk, low Df compositions with higher inorganic filler loading are shown in Table 6:

TABLE 6

| Typical Property | Test Method | Test Description | Unit | E2.1 | E2.2 | E2.3 |
|---|---|---|---|---|---|---|
| Density | Specific Gravity | ASTM D792 | g/cm$^3$ | 1.731 | 1.635 | 1.757 |
| MVR | 300° C./ 5.0 kg | ASTM D1238 | cm$^3$/10 min | 7.3 | 8.6 | 6.2 |
| Notched IZOD | 23° C., 5 lbf/ft | ASTM D256 | J/m | 34 | 23 | 34 |

TABLE 6-continued

| Typical Property | Test Method | Test Description | Unit | E2.1 | E2.2 | E2.3 |
|---|---|---|---|---|---|---|
| Unnotched IZOD | 23° C., 5 lbf/ft | ASTM D256 | J/m | 106 | 106 | 107 |
| HDT | 1.82 MPa/ 3.2 mm | ASTM D648 | ° C. | 139 | 137 | 140 |
| HDT | 0.45 MPa/ 3.2mm | ASTM D648 | ° C. | 149 | 146 | 149 |
| Flexural Modulus | 3.2 mm, 1.27 mm/min | ASTM D790 | MPa | 7060 | 8260 | 7530 |
| Flexural Strength | At break, 3.2 mm, 1.27 mm/min | ASTM D790 | MPa | 66 | 64 | 76 |
| Tensile Modulus | 5 mm/min | ASTM D638 | MPa | 7721 | 8703 | 8312 |
| Tensile Strength | At break, 5 mm/min | ASTM D638 | MPa | 46 | 46 | 49 |
| Tensile Elongation | At break, 5 mm/min | ASTM D638 | % | 0.93 | 0.73 | 0.79 |
| Dk | 1.1 GHz | SABIC Method | / | 4.90 | 4.39 | 4.61 |
| Df | 1.1 GHz | SABIC Method | / | 0.00082 | 0.00063 | 0.00095 |
| Dk | 1.9 GHz | SABIC Method | / | 4.93 | 4.41 | 4.61 |
| Df | 1.9 GHz | SABIC Method | / | 0.00092 | 0.00081 | 0.00123 |
| Dk | 5.0 GHz | SABIC Method | / | 5.04 | 4.42 | 4.61 |
| Df | 5.0 GHz | SABIC Method | / | 0.00133 | 0.00121 | 0.00160 |
| Thermal Conductivity | Through plane | ASTM E1461 | W/(m·K) | 1.19 | 1.43 | 1.02 |
| Thermal Conductivity | In plane | ASTM E1461 | W/(m·K) | 3.38 | 4.75 | 3.36 |

When the overall filler loading in the composition was increased to 60%, thermal conductivity and dielectric performance could be greatly improved. As shown in E2.1, with 40% $TiO_2$ and 20% boron nitride, the through plane and in plane TC of the composition reached as high as 1.19 and 3.38 W/(m·K), respectively. Meanwhile, high Dk (4.90 at 1.1 GHz) and low Df (0.00082 at 1.1 GHz) performance were obtained.

When the loading of boron nitride was increased to 30%, thermal conductivity of the composition could be further increased, with the through plane TC of 1.43 W/(m·K) and in plane TC of 4.75 W/(m·K) (see E2.2). Good dielectric properties were obtained as well, showing high Dk (4.39 at 1.1 GHz) and low Df (0.00063 at 1.1 GHz) performance (see E2.2).

When talc was used as the thermal conductive filler, as shown in E2.3, good thermal conductivity and good dielectric performance could also be obtained. The through plane and in plane thermal conductivity of the composition were 1.02 and 3.36 W/(m·K), respectively. Dk and Df of the composition were 4.61 and 0.00095 at 1.1 GHz, respectively (see E2.3).

Based on the selected components, thermal conductivity and Dk of the developed composition may be adjusted via changing the filler loading and filler category, while the Df of the composition may be maintained at a very low level, that is, Df<0.002 at 1.1 to 5 GHz.

The above description is intended to be illustrative, and not restrictive. For example, the above-described examples (or one or more aspects thereof) may be used in combination with each other. Other aspects can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed aspect. Thus, the following claims are hereby incorporated into the Detailed Description as examples or aspects, with each claim standing on its own as a separate aspect, and it is contemplated that such aspects can be combined with each other in various combinations or permutations. The scope of the disclosure should be determined with reference to the appended claims, along with the full scope of equivalents to which such claims are entitled.

The patentable scope of the disclosure is defined by the claims, and can include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed:

1. A polymer composition comprising:
   from about 20 wt. % to about 80 wt. % of a polymer base resin comprising a polyarylene ether, a polystyrene, a polypropylene, or a combination thereof;
   from about 10 wt. % to about 60 wt. % of a thermally conductive filler;

from about 5 wt. % to about 30 wt. % of an impact modifier, wherein the impact modifier comprises a styrene-based copolymer; and from about 5 wt. % to about 60 wt. % of a dielectric ceramic filler, wherein the polymer composition exhibits a dielectric constant greater than 3.0 at 1.1 GHz when tested using a split post dielectric resonator and network analyzer on a sample size of 120 mm by 120 mm and 6 mm thickness according to ASTM D150, wherein the polymer composition exhibits a dissipation factor of less than 0.002 at 1.1 GHz when tested using a split post dielectric resonator and network analyzer on a sample size of 120 mm by 120 mm and 6 mm thickness according to ASTM D150, and wherein the combined weight percent value of all components does not exceed about 100 wt. %, and all weight percent values are based on the total weight of the composition.

2. The polymer composition of claim 1, wherein the dielectric ceramic filler has a Dk of at least 20 when measured at 1.1 GHz or greater.

3. The polymer composition of claim 1, wherein the polymer composition exhibits a dissipation factor at 1.1 GHz that is less than that of a substantially similar polymer composition in the absence a thermally conductive filler when tested using a split post dielectric resonator and network analyzer on a sample size of 120 mm by 120 mm and 6 mm thickness according to ASTM D150.

4. The polymer composition of claim 1, wherein the polymer composition exhibits a dissipation factor that is less than 0.002 at 1.9 GHz when tested using a split post dielectric resonator and network analyzer on a sample size of 120 mm by 120 mm and 6 mm thickness according to ASTM D150.

5. The polymer composition of claim 1, wherein the thermally conductive filler comprises zinc sulfide, calcium oxide, magnesium oxide, zinc oxide, titanium dioxide, tin dioxide, chromium oxide, calcium carbonate, mica, barium oxide, barium sulfate, calcium sulfate, wollastonite, zirconium oxide, silicon oxide, glass beads, glass fiber, magnesium aluminate, dolomite, coated graphite, magnesium hydroxide, talc, boehmite, diaspore, gibbsite, -clay, aluminum nitride, aluminum carbide, aluminum oxide, boron nitride, aluminum oxynitride, magnesium silicon nitride, silicon carbide, silicon nitride, tungsten oxide, aluminum phosphide-, beryllium oxide, boron-phosphide-, cadmium sulfide, gallium nitride, zinc silicate, tungsten oxide, or a combination thereof.

6. The polymer composition of claim 1, wherein the thermally conductive filler comprises boron nitride.

7. The polymer composition of claim 1, wherein the thermally conductive filler comprises magnesium hydroxide, boron nitride, or a combination thereof.

8. The polymer composition of claim 1, wherein the thermally conductive filler comprises talc.

9. The composition of claim 1, wherein the thermally conductive filler has a thermal conductivity of at least about 5 W/m*K.

10. The polymer composition of claim 1, wherein the dielectric ceramic filler comprises barium titanate, titanium dioxide, boron nitride, silicon carbide, silicon nitride, zinc oxide, or a combination thereof.

11. The composition of claim 1, wherein the dielectric ceramic filler comprises inorganic oxides, silicates, or a combination thereof.

12. The polymer composition of claim 1, wherein the impact modifier comprises a styrene-based copolymer selected from the group consisting of styrene ethylene butylene styrene copolymer (SEBS), styrene butadiene styrene (SBS), styrene ethylene propylene styrene (SEPS), and combinations thereof.

13. The polymer composition of claim 1, wherein the composition further comprises an additive selected from a pigment, a dye, a filler, a plasticizer, a fiber, a flame retardant, an antioxidant, a lubricant, wood, glass, metal, an ultraviolet agent, an anti-static agent, an anti-microbial agent, or a combination thereof.

14. An article comprising the polymer composition of claim 1.

15. The article of claim 14, wherein the article is a component of an electronic device.

16. A method of forming a polymer composition comprising:
combining:
from about 20 wt. % to about 80 wt. % of a polymer base resin comprising a polyarylene ether, a polystyrene, a polypropylene, or a combination thereof;
from about 10 wt. % to about 60 wt. % of a thermally conductive filler;
from about 5 wt. % to about 30 wt. % of an impact modifier, wherein the impact modifier comprises a styrene-based copolymer; and
from about 5 wt. % to about 60 wt. % of a dielectric ceramic filler,
wherein the polymer composition exhibits a dielectric constant greater than 3.5 at 1.1 GHz when tested using a split post dielectric resonator and network analyzer on a sample size of 120 mm by 120 mm and 6 mm thickness according to ASTM D150,
wherein the polymer composition exhibits a dissipation factor of less than 0.001 at 1.1 GHz when tested using a split post dielectric resonator and network analyzer on a sample size of 120 mm by 120 mm and 6 mm thickness according to ASTM D150, and
wherein the combined weight percent value of all components does not exceed about 100 wt. %, and all weight percent values are based on the total weight of the composition.

* * * * *